(12) United States Patent
Fatschel

(10) Patent No.: US 12,397,362 B2
(45) Date of Patent: Aug. 26, 2025

(54) GaN CLAMP WITH UNIFORM PRESSURE

(71) Applicant: MKS Inc., Andover, MA (US)

(72) Inventor: Stephan R. Fatschel, Seven Fields, PA (US)

(73) Assignee: MKS Inc., Andover, MA (US)

( * ) Notice: Subject to any disclaimer, the term of this patent is extended or adjusted under 35 U.S.C. 154(b) by 932 days.

(21) Appl. No.: 17/365,479

(22) Filed: Jul. 1, 2021

(65) Prior Publication Data

US 2023/0001500 A1    Jan. 5, 2023

(51) Int. Cl.
| | |
|---|---|
| *B23K 3/08* | (2006.01) |
| *B25B 5/08* | (2006.01) |
| *H05K 3/00* | (2006.01) |
| *B23K 101/42* | (2006.01) |

(52) U.S. Cl.
CPC .............. *B23K 3/087* (2013.01); *B25B 5/087* (2013.01); *H05K 3/0008* (2013.01); *B23K 2101/42* (2018.08)

(58) Field of Classification Search
CPC .. B23K 3/087; B23K 2101/42; H05K 3/0008; B25B 5/087; H01L 23/4006; H01L 24/72
See application file for complete search history.

(56) References Cited

U.S. PATENT DOCUMENTS

| | | | | |
|---|---|---|---|---|
| 3,226,466 | A * | 12/1965 | Martin | H01L 25/117 257/E23.083 |
| 3,571,663 | A * | 3/1971 | Hungate | H01L 23/4006 361/717 |
| 3,688,159 | A * | 8/1972 | Robbins | H01L 23/4006 174/16.3 |
| 4,159,483 | A * | 6/1979 | Bettin | H01L 23/32 257/722 |
| 4,636,917 | A * | 1/1987 | Jouanny | H01L 25/117 361/709 |
| 6,549,410 | B1 * | 4/2003 | Cohen | H01L 23/4006 361/801 |
| 8,134,835 | B2 * | 3/2012 | Fishman | H01L 24/72 174/16.3 |

(Continued)

OTHER PUBLICATIONS

Panasonic Product Standards, *Panasonic PGA26E19BA E Data Sheet*, Dated: Mar. 7, 2019, 14 Pages, Revision 008.

(Continued)

*Primary Examiner* — Seahee Hong
(74) *Attorney, Agent, or Firm* — Kurt M. Eaton

(57) ABSTRACT

A circuit board clamp includes a clamp frame having a first and second frame supports. The clamp frame also includes a top plate arranged between the first and second frame supports. The top plate supports a piston via a threaded fastener engaging a top plate aperture. The piston may be displaced relative to the top plate in accordance with adjustment of the threaded fastener. A pressure plate assembly has a pressure plate and a stem attached to the pressure plate. The stem is positioned within a tubular section of the piston, and the pressure plate is positioned opposite the circuit board from the heat sink. The pressure plate contacts a surface mounted integrated circuit between the circuit board and the pressure plate. A bias member is seated on the bias seat and applies a biasing force on the pressure plate.

8 Claims, 5 Drawing Sheets

(56) References Cited

U.S. PATENT DOCUMENTS

2012/0229999 A1\* 9/2012 Hussain ............. G01R 31/2886
361/783

OTHER PUBLICATIONS

MKS Instruments Inc., *Fet Clamp Design Information*, Dated: Jun. 30, 2020, 1 Page.
Da Yu, Hohyung Lee, *Reliability Assessment of Preloaded Solder Joint Under Thermal Cycling*; Article, Dated: Dec. 2012, 6 Pages, vol. 134.
Nicholas Graziano, Harry Schoeller, PhD, Lars Bruno, *Effect of TIM Compression Loads on BGA Reliability*, Dated: Oct. 14-18, 2018, 11 Pages, Published in Proceedings of SMTA International.
Nick Padfield, *Mounting Guidelines for Semelab RF MOSFETs*, Dated: Nov. 30, 2020, 1 Page, Published in Semelab PLC UK.

\* cited by examiner

GaN CLAMP WITH UNIFORM PRESSURE

FIELD

The present disclosure relates to some conductor devices and to a clamp for a semi-conductor device.

BACKGROUND

In semiconductor fabrication, ions are accelerated by an electric field to etch material from or deposit material onto a surface of a substrate. In various configurations, the electric field is generated based on Radio Frequency (RF) or Direct Current (DC) power signals generated by a respective RF or DC generator of a power delivery system. The power signals generated by the generator must be precisely controlled to effectively execute etching and deposition.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One general aspect includes a circuit board clamp having a clamp frame including a first frame support passing through a first aperture of a circuit board and fastened to a heat sink, a second frame support passing through a second aperture of the circuit board and fastened to the heat sink, and a top plate arranged between the first frame support and the second frame support, the top plate including a top plate aperture. The clamp also includes a piston supported by the top plate via a threaded fastener engaging the top plate aperture, the piston arranged to be displaced relative to the top plate in accordance with adjustment of the threaded fastener, the piston including a tubular section having a bias seat. The clamp also includes a pressure plate assembly including a pressure plate and a stem attached to the pressure plate, the stem positioned within the tubular section for translation therein, the pressure plate positioned opposite the circuit board from the heat sink, the pressure plate contacting a surface mounted integrated circuit between the circuit board and the pressure plate. The clamp also includes a bias member seated on the bias seat and applying a biasing force on the pressure plate to urge the surface mounted integrated circuit into contact with the circuit board.

Implementations may include one or more of the following features. The circuit board clamp where the bias member is one of a coil spring or a Belleville washer. One of the first frame support or the second frame support includes a threaded portion for receiving a fastener to mount the circuit board clamp to the heat sink. The circuit board clamp may include a cylinder supported by the top plate, where in the piston translates within the cylinder.

One general aspect includes a circuit board clamp having a first fastener passing through a first aperture of a circuit board and fastened to a heat sink, the first fastener including a first bias seat. The clamp also includes a second fastener passing through a second aperture of the circuit board and fastened to the heat sink, the second fastener including a second bias seat. The clamp also includes a planar support plate opposite the circuit board from the heat sink and biased towards the circuit board, where the planar support plate applies a biasing force to a surface mounted integrated circuit between the circuit board and the planar support plate to bias the surface mounted integrated circuit toward the circuit board. The clamp also includes a first bias member seated on the first bias seat to provide a first biasing force to the planar support plate. The clamp also includes a second bias member seated on the second bias seat to provide a second biasing force to the planar support plate.

Implementations may include one or more of the following features. The circuit board clamp where at least one of the first bias member of the second bias member is one of a coil spring or a Belleville washer. One of the first fastener or the second fastener includes a threaded portion threadably engaging the heat sink to mount the circuit board clamp to the heat sink. At least one of the first fastener or the second fastener may include: a shank; and a threaded portion at one end of the shank, the threaded portion engaging a seat sink fastened the one of the first fastener or the second fastener to the heat sink. The shank further may include a groove for receiving a ring, where in the ring is formed to engage the circuit board to prevent translation of the circuit board along the shank.

One general aspect includes a circuit board assembly having a heat sink. The assembly also includes a circuit board having a first side and a second side, where one of the first side or the second side opposes and is in thermal contact with the heat sink and where the circuit board includes a plurality of apertures. The assembly also includes a surface mounted integrated circuit attached to an other of the first side or the second side of the circuit board, the surface mounted integrated circuit including a plurality of electrical conductors on one of a first surface or a second surface of the surface mounted integrated circuit and the one of the first surface or the second surface of the surface mounted integrated circuit opposes the other of the first side or the second side of the circuit board to enable electrical contact between the surface mounted integrated circuit and the circuit board. The assembly also includes a clamp frame including a first frame support passing through a first aperture of the plurality of apertures of the circuit board and fastened to the heat sink, a second frame support passing through a second aperture of the plurality of apertures of the circuit board and fastened to the heat sink, and a top plate arranged between the first frame support and the second frame support, the top plate including a top plate aperture. The assembly also includes a piston supported by the top plate via a threaded fastener, the piston arranged to be displaced relative to the top plate, the piston including a tubular section having a bias seat. The assembly also includes a pressure plate assembly including a pressure plate and a stem attached to the pressure plate, the stem positioned within the tubular section for translation therein, the pressure plate positioned opposite the circuit board from the heat sink, the pressure plate contacting the surface mounted integrated circuit. The assembly also includes a bias member seated on the bias seat and applying a biasing force on the pressure plate to urge the surface mounted integrated circuit into contact with the circuit board.

Implementations may include one or more of the following features. The circuit board assembly where the bias member is one of a coil spring or a Belleville washer. One of the first frame support or the second frame support includes a threaded portion for receiving a fastener to mount the clamp frame to the heat sink. The circuit board assembly may include a cylinder supported by the top plate, where in the piston translates within the cylinder.

One general aspect includes a circuit board assembly having a heat sink. The assembly also includes a circuit board having a first side and a second side, where one of the first side or the second side opposes and is in thermal contact with the heat sink and where the circuit board includes a plurality of apertures. The assembly also includes a surface mounted integrated circuit attached to an other of the first side or the second side of the circuit board, the surface mounted integrated circuit including a plurality of electrical conductors on one of a first surface or a second surface of the surface mounted integrated circuit and the one of the first surface or the second surface of the surface mounted integrated circuit opposes the other of the first side or the second side of the circuit board to enable electrical contact between the surface mounted integrated circuit and the circuit board. The assembly also includes a first fastener passing through a first aperture of the plurality of apertures and fastened to the heat sink, the first fastener including a first bias seat. The assembly also includes a second fastener passing through a second aperture of the plurality of apertures and fastened to the heat sink, the second fastener including a second bias seat. The assembly also includes a planar support plate opposite the other of the first surface or the second surface of the surface mounted integrated circuit and biased towards the other of the first surface or the second surface of the surface mounted integrated circuit via a first bias member disposed in proximity to a first end of the planar support plate and seated in the first bias seat and a second bias member disposed in proximity to a second end of the planar support plate and seated in the second bias seat.

Implementations may include one or more of the following features. The circuit board assembly where at least one of the first bias member of the second bias member is one of a coil spring or a Belleville washer. At least one of the first fastener or the second fastener may include: a shank; and a threaded portion at one end of the shank, the threaded portion engaging a seat sink fastened the one of the first fastener or the second fastener to the heat sink. The shank further may include a groove for receiving a ring, where in the ring is formed to engage the circuit board to prevent translation of the circuit board along the shank. One of the first fastener or the second fastener includes a threaded portion threadably engaging the heat sink to mount the first or second fastener to the heat sink.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
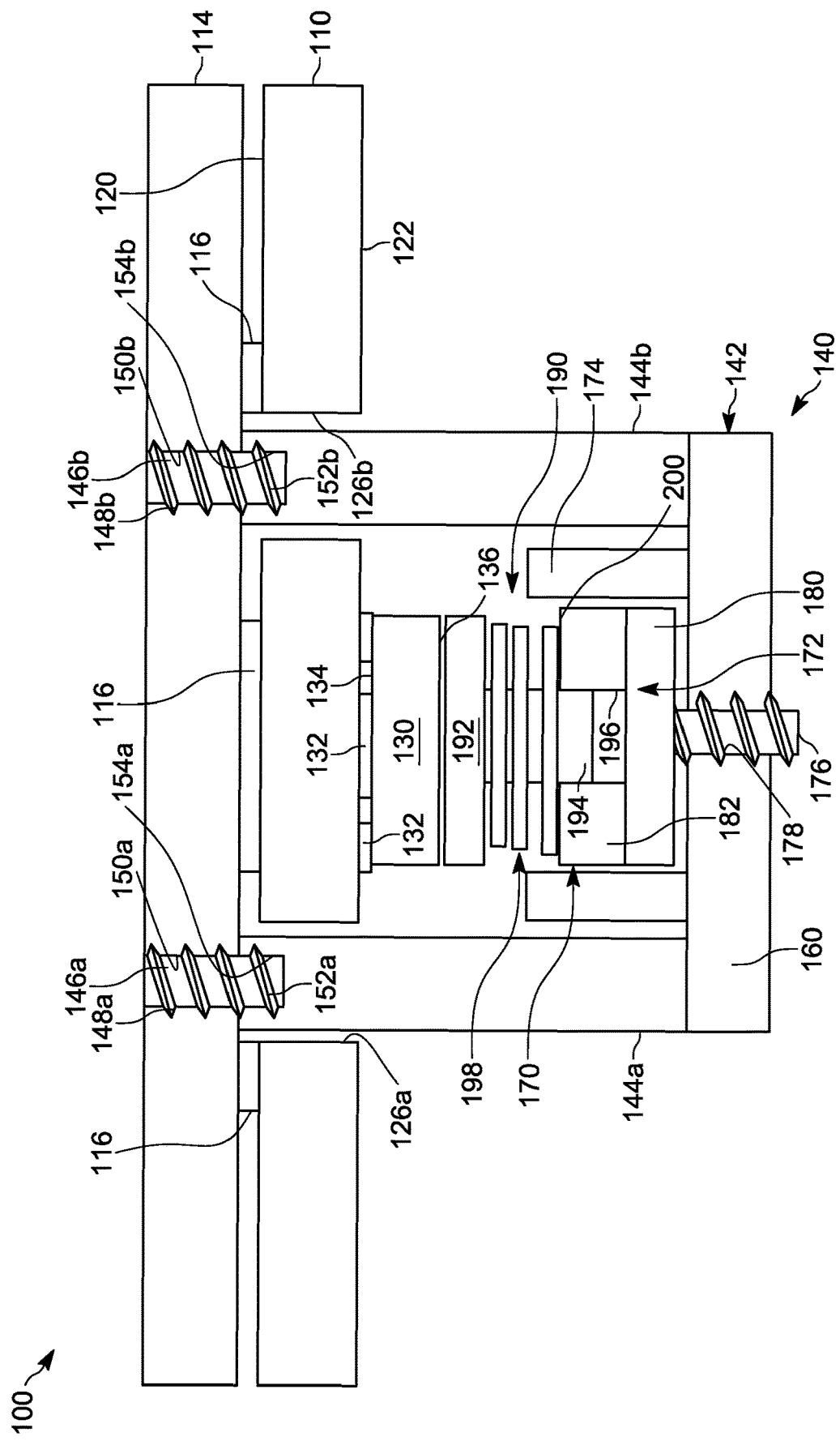
FIG. 1 is a partial, cross-sectional side view of a circuit board and clamp assembly arranged in accordance with the present disclosure.

In various manufacturing processes, RF power may be applied to a reactor, such as a plasma chamber, in order to cause a reaction within a container to effect various deposition, sputtering, and manufacturing processes. As the power demands of the manufacturing processes continue to increase, the RF power generators developed to supply RF power to manufacturing vessels continue to evolve in order to meet the ever-increasing demands. Conventional generators typically use one or more pairs of power metal oxide semiconductor field effect transistors (MOSFETs) to generate the desired RF power. As manufacturing demands and tolerances continue to increase, alternatives to MOSFETs are considered for the RF power devices. One such alternative is gallium nitride (GaN) transistors. Gallium nitride transistors typically provide more gain and higher frequency and do so at improved efficiency compared to MOSFET technology. Gallium nitride also has a high activation, which results in desirable thermal properties and a significantly higher breakdown voltage.

Whether RF power devices are using MOSFET or GaN devices, both devices generate heat, which must be dissipated in order to protect the RF power devices and the RF generator housing the RF power devices. One particular benefit of GaN devices is that they may be board mounted, as compared to flange mounted, as MOSFET power devices are typically mounted in RF generators. Board mounting can both preserve space and reduce costs. However, board mounted power transistors present particular challenges with respect to heat dissipation. It should be understood that while the present disclosure discusses GaN transistors, the disclosure herein is also equally applicable to other board-mounted power transistors, including in a non-limiting example processors, microprocessors, and the like.

Some GaN devices may be top cooled. A top cooled device requires a thermal interface material, such as a pad between the device and heatsink. However, such a configuration exerts pressure on the solder joint which must be limited to a predetermined pressure in order to prevent damage to the solder joint. Such top cooled devices can result in the bending of the GaN power transistors since bending and GaN power transistors may be limited to 50-120 µm. Depending on the style, use of a thermal interface material and heat sink requires fairly tight tolerances. Other GaN devices may be bottom cooled. For high heat dissipation, thermal vias may be manufactured into the circuit board to which the GaN devices are mounted. Further, a thermal pad under pressure may be used to increase cooling of such board mount devices. Ideally, pressure should be applied in a way to eliminate any bending stresses on the GaN power devices and the board to which the GaN power devices are mounted. In either the top cooled or bottom cooled configurations, using a thermal pad typically requires a clamp in order to improve heat transfer to enhance the cooling.

Present clamps fail to provide the desired combination of sufficient clamping force while limiting bending of the GaN power transistors, the solder joints, and the circuit board to which the GaN power transistors are mounted. Conventional clamps typically provide either a linear, edge, or point source pressure between the power transistor and the circuit board, which fails to provide the desired uniform pressure and often limits adjustability of the clamping force. An example clamping device that provides uniform linear, edge, or point source pressure include spring clips. Other clamping devices use multiple fasteners arranged about a periphery of the power transistor device to cause a pressure plate to apply a clamping force between the power transistor and the board RF power to which the board transistors are mounted. However, such plates are typically clamped at a point source location, defined by each of the fasteners, so that bending and non-uniform pressure can still result.

FIG. 1 shows a circuit board assembly 100 including the circuit board 110 connected to a heat sink 114 via one or more thermal pads 116. Circuit board no may be formed of any material conventionally known in the art, such as a FR4. Heatsink 114 may be formed of any conventional heatsink material as is known in the art. Thermal pads 116 may be formed of an electrically non-conductive material and a thermally conductive material, such as, in a non-limiting example, silicone-based material, either with or without reinforcement, and phase change materials. Circuit board 110 includes a first side 120 and a second side 122. First side 120 opposes heatsink 114 and is in thermal contact with heatsink 114 via thermal pads 116. Circuit board 110 includes a plurality of apertures 126a, 126b.

Circuit board assembly 100 also includes a surface mounted integrated circuit 130, such as a GaN RF power device, attached to second side 122 of circuit board no. Surface mounted integrated circuit 130 includes a plurality of electrical conductors 132 formed on one of a first surface 134 of surface mounted circuit 130. As shown in FIG. 1, surface 134 of surface mounted integrated circuit 130 opposes side 122 of circuit board 110 to enable electrical contact between surface mounted integrated circuit 130 and circuit board 110.

Circuit board assembly 100 also includes a clamp assembly 140 including a clamp frame 142. Clamp frame 142 includes a pair of first frame supports 144a, 144b, a first frame support and a second frame support, passing through respective apertures 126a, 126b, first and second apertures, and engaging heatsink 114. Frame supports 144a, 144b, connect to heatsink 114 via fasteners 146a, 146b, first and second fasteners, which threadably engage respective threads 148a, 148b, formed in a respective bores or apertures 150a, 150b of heatsink 114 and also threadably engage respective threads 152a, 152b, formed in bores or apertures 154a, 154b, of frame supports 144a, 144b.

Clamp frame assembly 140 also includes a top plate 160 arranged between frame supports 144a, 144b. In various embodiments, frame supports 144a, 144b, and top plate 160 may be formed as a single assembly, such as by machining a block of material or by 3-D printing. In various embodiments, clamp frame assembly 140, particularly frame supports 144a, 144b, and top plate 160 may be formed of steel or aluminum in non-limiting examples.

Clamp frame assembly 140 also includes a piston assembly 170 supported by top plate 160. Piston assembly 170 includes a piston 172 that translates within a cylinder or piston cage 174. Piston 172 translates within cylinder 174 by adjustment of a setscrew 176 that engages top plate 166 via threads 178. Similarly as described with respect to clamp frame assembly 140, cylinder or piston cage 174 may be integrally formed as part of clamp frame assembly 140. Piston 172 may be formed of a first member 180 and a second member 182, which may be separate fastened elements or may be formed of a single unit machined from a block of material or fabricated using 3-D printing techniques.

Clamp frame assembly 140 also includes a pressure plate assembly 190 including a pressure plate 192 and a stem 194, which are connected or integrally formed as described above. Stem 194 reciprocates within a cylinder or tubular section 196. A bias member, spring or spring assembly 198 is seated on a top section or spring seat 200 of member 182. Pressure plate 192 generates a uniform force on surface mounted integrated circuit 130 to provide a uniform force between surface mounted integrated circuit 130 and circuit board 110, through solder joints 132.

Bias member, spring, or spring assembly 198 may be a coil spring or Belleville washers and may generate a spring force to provide a predetermined pressure urging surface mounted integrated circuit 130 into contact with circuit board 110. The desired pressure may be determined in accordance with vendor recommendations for thermal pad 116 or maybe determined empirically through, by non-limiting example, finite element studies. Pressure between the pressure plate 198 and heatsink 114 may be varied through adjustment of setscrew 176, which displaces piston 172, causing compression of spring assembly 198. Further, repeatable pressure may be applied across multiple clamp frame assemblies through identical turns of setscrew 176 and consistent selection of spring 198, whether coil springs or Belleville washers.

Figure 2:
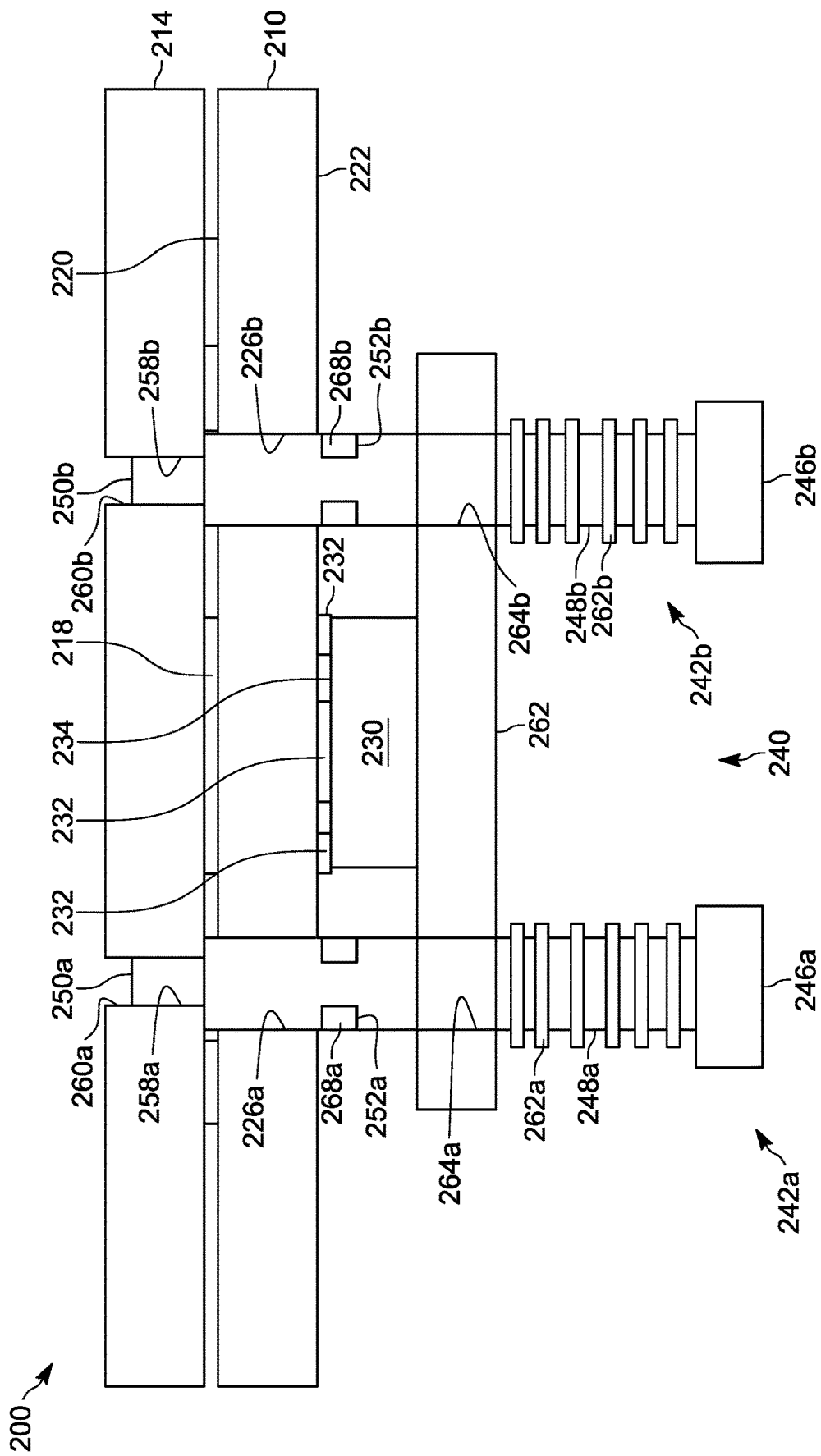
FIG. 2 is a partial, cross-sectional side view of a circuit board and clamp assembly arranged in accordance with the present disclosure.

FIG. 2. depicts a circuit board assembly 200 including a circuit board 210 and a heatsink to 214. Circuit board 210 includes a first side 220 and a second side 222. First side 220 opposes and is in thermal contact with heatsink 214. Circuit board 210 includes a plurality of apertures to 226a, 226b, first and second apertures. A surface mount integrated circuit 230 attaches to second side 222 of circuit board 210. Surface mounted integrated circuit 230 includes a plurality of electrical conductors 232 formed on a first surface 234 of surface mounted integrated circuit 230, and surface 234 opposes circuit board 210 to enable electrical contact between surface mounted integrated circuit 230 and circuit board 210.

Circuit board assembly 200 includes a clamp assembly 240 including fasteners 242a, 242b, first and second fasteners. Fasteners 242a, 242b, includes respective heads 246a, 246b and shanks 248a, 248b, and threaded portions 250a, 250b. Shank 248a, 248b includes grooves 252a, 252b. The threaded portions 250a, 250b of fasteners 242a, 242b engage respective corresponding threads 258a, 258b formed in bores 260a, 260b of heatsink 214. Clamp assembly 240 includes a support plate 262 having bores or apertures 264a, 264b through which respective fasteners 242a, 242b pass.

Clamp assembly 240 is constructed by passing the threaded portions 250a, 250b and shanks 248a, 248b of fasteners 242a, 242b through respective boards 264a, 264b and bores 266a, 266b of circuit board 210. Fasteners 242a, 242b are tightened so that respective shanks 248a, 248b bottom out onto heatsink 214. C clamps or rings 268a, 268b are seated in respective grooves 252a, 252b of fasteners 242a, 242b. C clamps or rings 252a, 252b and provide a compressive force between circuit board 210 and heatsink 214 and prevent circuit board 210 from translating or displacing along shank 248a, 248b of respective fasteners 242a, 242b. Also during assembly, fasteners 242a, 242b pass through respective bias members 262a, 262b, such as a coil spring or a set of Belleville washers, and are seated against respective heads 246a, 246b of fastener 242a, 242b. Bias members 262a, 262b exert a force on support plate 262 urging support plate 262, and surface mounted integrated circuit 230 toward circuit board 210 and heatsink 214. Thus, fasteners 242a, 242b cooperate to provide a clamping force between surface mounted integrated circuit 230 and heatsink 214, through circuit board 210, solder joints 232, and thermal pad 218 to improve heat transfer from surface mounted integrated circuit 232 heatsink 214.

Figure 3:
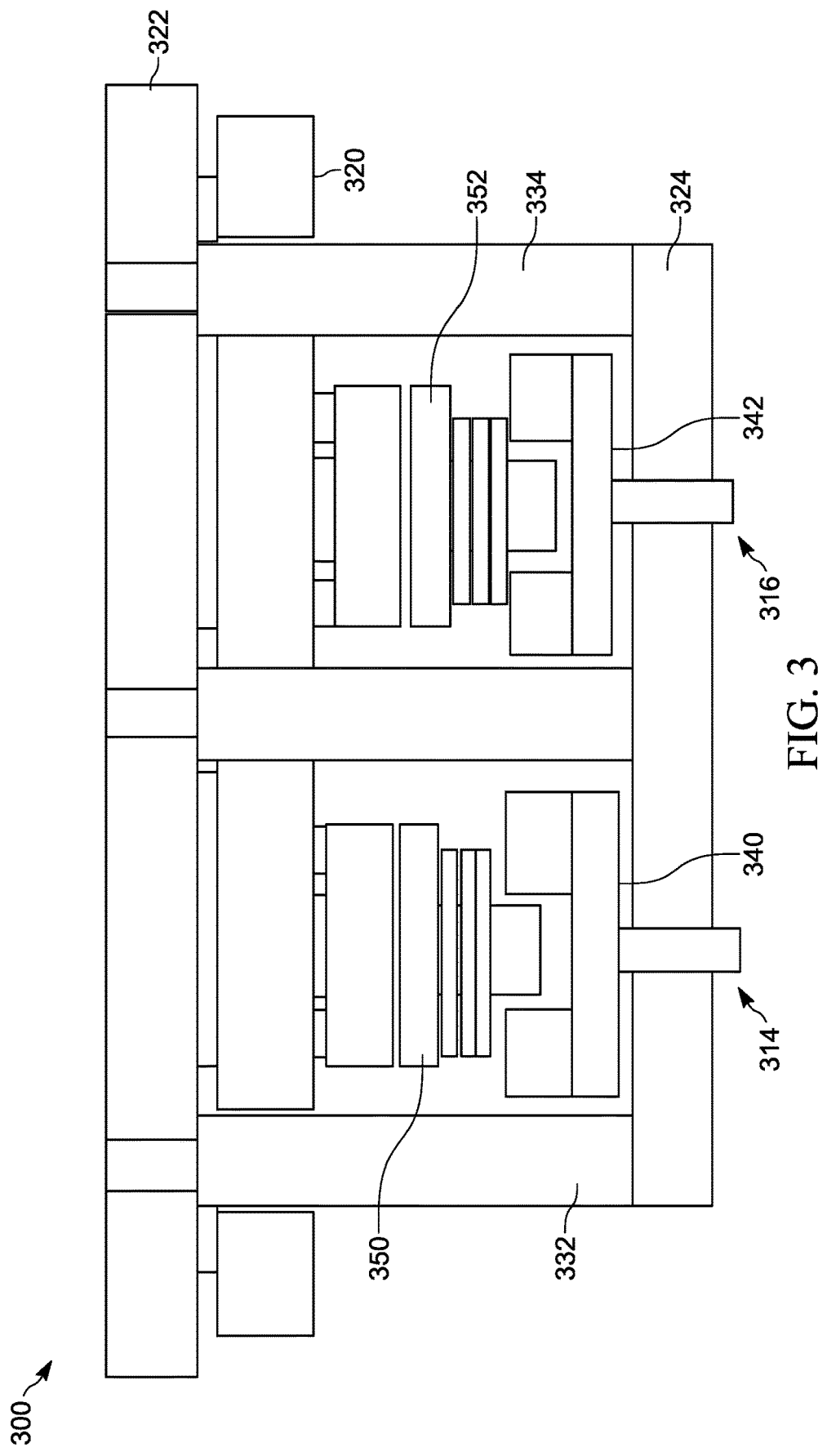
FIG. 3 is a partial, cross-sectional side view of a circuit board and multiple clamp assembly arranged in accordance with the present disclosure.
Figure 4:
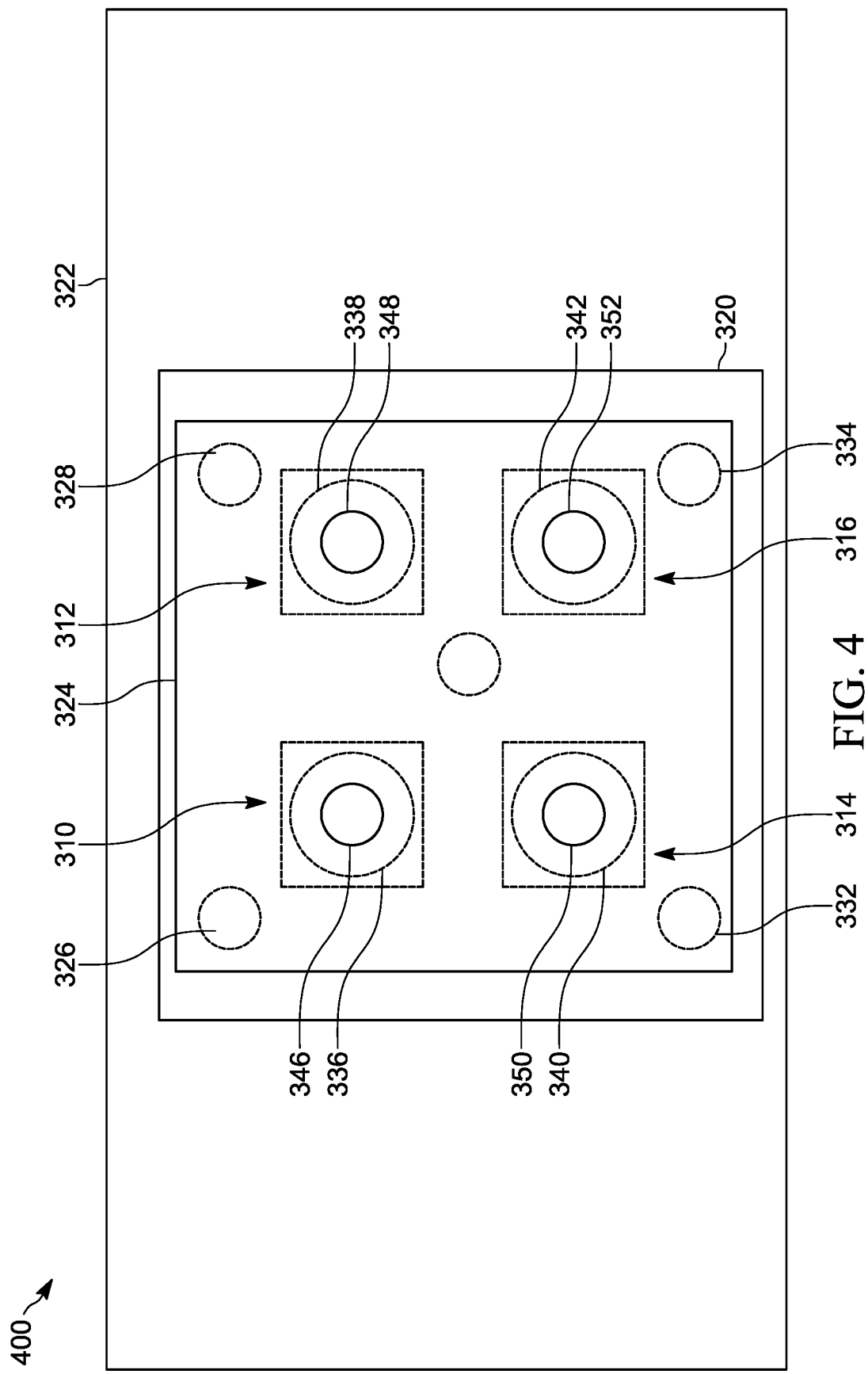
FIG. 4 is a top view of the circuit board and multiple clamp assembly of FIG. 3.

FIG. 3 and FIG. 4 show a circuit board clamp assembly from a side view 300 and a top view 400. The views 300, 400 of respective FIGS. 3 and 4 are described herein with respect to an implementation relying on circuit board assembly 100 and clamping 140 assembly described in FIG. 1. However, the multi-clamp assembly described in FIGS. 3 and 4 can be implemented using the circuit board assembly clamp assembly of FIG. 2.

Side view 300 shows a first clamp assembly 314 and a second clamp assembly 316 which are configured as described with respect to FIG. 1. As shown in top view 400, the surface mounted integrated circuit devices and corresponding clamping assemblies in FIGS. 3 and 4 are referenced in combination using reference numbers 310, 312, 314, 316. FIG. 4 depicts a schematic for surface mounted integrated circuit and clamping assemblies 310, 312, 314, 316 and also depicts in schematic of circuit board 320, heatsink 322, and top plate 324. Also shown in schematic are frame supports 326, 328, 330, 332, 334; pistons 336, 338, 340, 342; and pressure plates 346, 348, 350, 352. Thus, from FIGS. 3 and 4, the concepts can be implemented with respect to multiple RF power generation devices arranged on a single circuit board.

Figure 5:
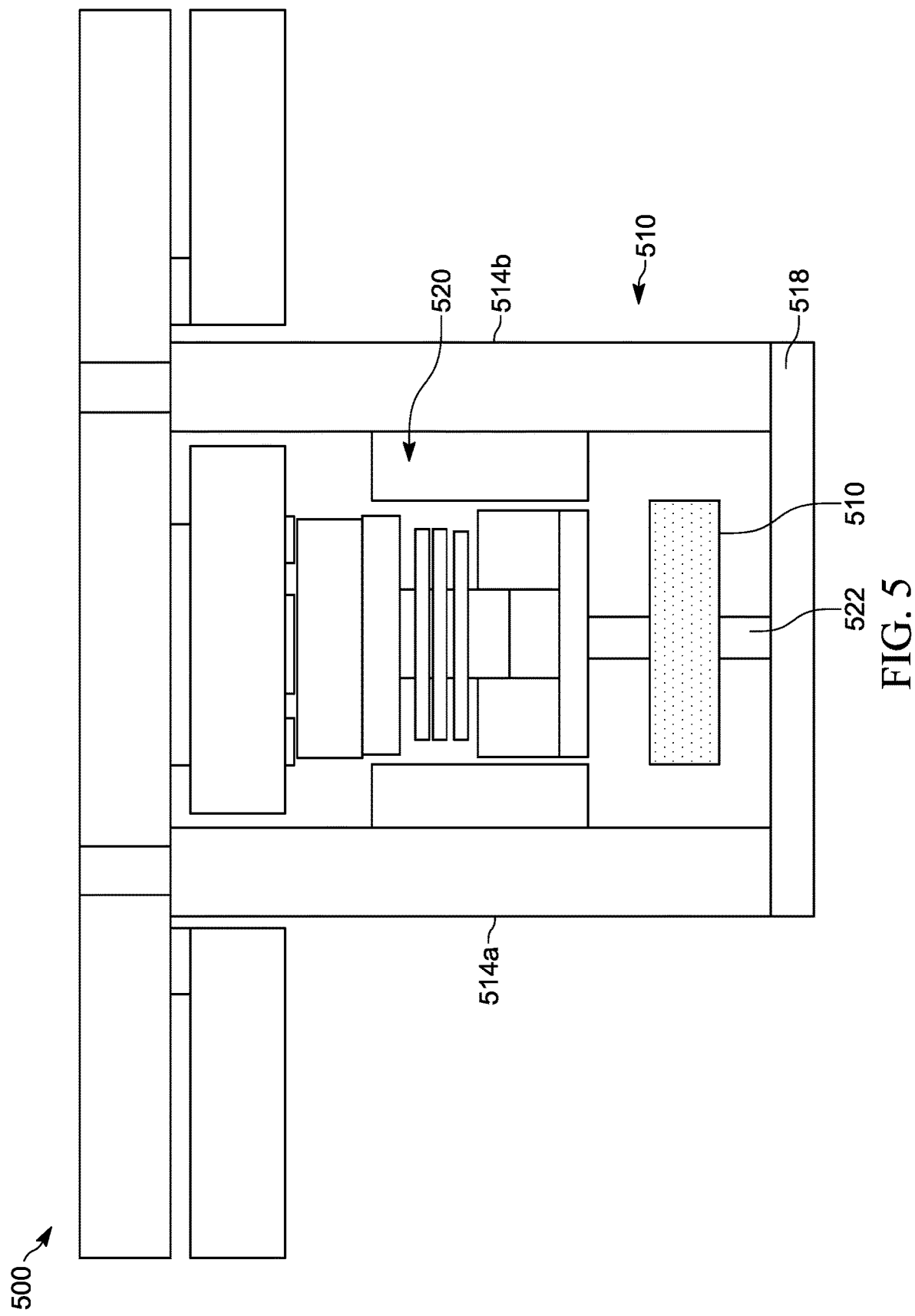
FIG. 5 is a side view of a circuit board and clamp assembly arranged in accordance with the present disclosure.

FIG. 5 shows a circuit board assembly 500 arranged similarly to FIG. 1. Like elements from FIG. 1 will not be described herein. FIG. 5 shows a jack or jack screw 510, which can be implemented in clamp assembly 512 by extending supports 514a, 514b, thereby displacing top plate 518 away from cylinder or piston cage 520. In the configuration of FIG. 5, cylinder or piston cage 520 is supported by respective frame supports 514a, 514b, rather than by top plate 518. Jack screw 510 threadably engages threaded member 522 so that rotational adjustment of jack 510 causes displacement of piston 524, providing further adjustment of the clamping force.

Thus, from the foregoing, the systems described herein provide a uniform pressure for a surface mounted integrated circuit across the surface mounted integrated device, the soldering surface, and the circuit board to which the surface moment integrated circuit is attached. The type of clamping assembly described herein can be reduced by biasing members formed of Belleville washers having high spring rate, which also provide for increased compressive force.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A circuit board clamp comprising:
    a clamp frame including a first frame support passing through a first aperture of a circuit board and fastened to a heat sink, a second frame support passing through a second aperture of the circuit board and fastened to the heat sink, and a top plate arranged between the first frame support and the second frame support, the top plate including a top plate aperture;

a piston supported by the top plate via a threaded fastener engaging the top plate aperture, the piston arranged to be displaced relative to the top plate in accordance with adjustment of the threaded fastener, the piston including a tubular section having a bias seat;

a pressure plate assembly including a pressure plate and a stem attached to the pressure plate, the stem positioned within the tubular section for translation therein, the pressure plate positioned opposite the circuit board from the heat sink, the pressure plate contacting a surface mounted integrated circuit between the circuit board and the pressure plate; and a bias member seated on the bias seat and applying a biasing force on the pressure plate to urge the surface mounted integrated circuit into contact with the circuit board.

2. The circuit board clamp of claim 1 wherein the bias member is one of a coil spring or a Belleville washer.

3. The circuit board clamp of claim 1 wherein one of the first frame support or the second frame support includes a threaded portion for receiving a fastener to mount the circuit board clamp to the heat sink.

4. The circuit board clamp of claim 1 further comprising a cylinder supported by the top plate, where in the piston translates within the cylinder.

5. A circuit board assembly comprising:

a heat sink;

a circuit board having a first side and a second side, wherein one of the first side or the second side opposes and is in thermal contact with the heat sink and wherein the circuit board includes a plurality of apertures;

a surface mounted integrated circuit attached to an other of the first side or the second side of the circuit board, the surface mounted integrated circuit including a plurality of electrical conductors on one of a first surface or a second surface of the surface mounted integrated circuit and the one of the first surface or the second surface of the surface mounted integrated circuit opposes the other of the first side or the second side of the circuit board to enable electrical contact between the surface mounted integrated circuit and the circuit board;

a clamp frame including a first frame support passing through a first aperture of the plurality of apertures of the circuit board and fastened to the heat sink, a second frame support passing through a second aperture of the plurality of apertures of the circuit board and fastened to the heat sink, and a top plate arranged between the first frame support and the second frame support, the top plate including a top plate aperture;

a piston supported by the top plate via a threaded fastener, the piston arranged to be displaced relative to the top plate, the piston including a tubular section having a bias seat;

a pressure plate assembly including a pressure plate and a stem attached to the pressure plate, the stem positioned within the tubular section for translation therein, the pressure plate positioned opposite the circuit board from the heat sink, the pressure plate contacting the surface mounted integrated circuit; and a bias member seated on the bias seat and applying a biasing force on the pressure plate to urge the surface mounted integrated circuit into contact with the circuit board.

6. The circuit board assembly of claim 5 wherein the bias member is one of a coil spring or a Belleville washer.

7. The circuit board assembly of claim 5 wherein one of the first frame support or the second frame support includes a threaded portion for receiving a fastener to mount the clamp frame to the heat sink.

8. The circuit board assembly of claim 5 further comprising a cylinder supported by the top plate, where in the piston translates within the cylinder.

\* \* \* \* \*